US009209275B1

United States Patent
Zou et al.

(10) Patent No.: US 9,209,275 B1
(45) Date of Patent: Dec. 8, 2015

(54) INTEGRATED CIRCUITS WITH MEMORY CELLS AND METHODS OF MANUFACTURING THE SAME

(71) Applicant: GLOBALFOUNDRIES Singapore Pte. Ltd., Singapore (SG)

(72) Inventors: Zheng Zou, Singapore (SG); Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/445,279

(22) Filed: Jul. 29, 2014

(51) Int. Cl.
*H01L 29/788* (2006.01)
*H01L 29/66* (2006.01)
*H01L 29/49* (2006.01)
*H01L 29/423* (2006.01)
*H01L 27/115* (2006.01)
*H01L 21/28* (2006.01)
*H01L 21/285* (2006.01)

(52) U.S. Cl.
CPC ...... *H01L 29/6656* (2013.01); *H01L 21/28273* (2013.01); *H01L 21/28518* (2013.01); *H01L 27/11521* (2013.01); *H01L 29/42328* (2013.01); *H01L 29/42336* (2013.01); *H01L 29/4975* (2013.01); *H01L 29/66825* (2013.01); *H01L 29/788* (2013.01)

(58) Field of Classification Search
CPC .............. H01L 29/778; H01L 29/4975; H01L 29/42328
USPC ......................................................... 257/316
See application file for complete search history.

(56) References Cited

U.S. PATENT DOCUMENTS

| 6,096,603 A * | 8/2000 | Chang et al. ................... 438/258 |
| 8,896,053 B2 * | 11/2014 | Chakihara et al. ............. 257/324 |

* cited by examiner

*Primary Examiner* — Tuan Nguyen
(74) *Attorney, Agent, or Firm* — Ingrassia Fisher & Lorenz, P.C.

(57) ABSTRACT

Integrated circuits and methods for producing the same are provided. A method for producing an integrated circuit includes removing a central plug from between a first memory cell and a second memory cell to define a center gap. Each of the first and second memory cells include a control gate with a control gate height, a cap overlying the control gate, a select gate adjacent to the control gate, and a select gate dielectric between the control gate and the select gate. The select gate is recessed to a select gate height while the cap overlies the control gate, where the select gate height is less than the control gate height. A memory spacer is formed overlying the select gate dielectric and adjacent to the control gate.

20 Claims, 10 Drawing Sheets

US 9,209,275 B1

INTEGRATED CIRCUITS WITH MEMORY CELLS AND METHODS OF MANUFACTURING THE SAME

TECHNICAL FIELD

The technical field generally relates to integrated circuits and methods for manufacturing integrated circuits, and more particularly relates to integrated circuits with floating gate memory cells and methods for manufacturing the same.

BACKGROUND

The semiconductor industry is continuously moving toward the fabrication of smaller and more complex microelectronic components with higher performance. Memory cells are an important part of many microelectronic components, and smaller and more reliable memory cells are desirable. One type of memory cell uses flash memory that is non-volatile and re-writable. Non-volatile memory retains stored information even when the memory cell is de-powered, and stored information can be changed when a memory cell is re-writable. Some memory cells for flash memory store information by either charging or draining an electrically isolated component, such as a floating gate, and the information is recalled by determining if the isolated component is charged or not. Floating gate memory cells are typically provided with associated control gates and select gates that are utilized in the storage, retrieval, and erasing of memory on the floating gate.

In some embodiments, floating gate memory cells are formed in pairs, with a central plug initially formed between a first and second floating gate memory cell. A control gate is positioned over the floating gate for the first and second memory cells, and a floating barrier is positioned between the control gate and the floating gate. The floating barrier is a dielectric that electrically separates the control gate from the floating gate. In the manufacturing process, a cap is positioned over the control gate so the floating gate, floating barrier, control gate, and cap form a "stack" of components. The select gate is formed adjacent to the stack and on the opposite side of the stack from the central plug. The central plug and the cap are removed during the manufacturing process. Removal of the cap often results in undesirable partial etching of the floating barrier positioned between the floating gate and the control gate because similar materials are often used in the cap and the floating barrier. Partial etching of the floating barrier can change the voltage or current needed to read or write from the memory cell. The floating barrier is etched to varying degrees for different memory cells, so the operation of a memory bank can be compromised because different memory cells require different voltages or currents. A typical memory bank does not provide individually customized voltages or currents for operation of individual memory cells, so some of the memory cells will not function properly.

Electrical connects present another challenge for floating gate memory cells. In a typical floating gate memory cell, the control gate and the select gate each extend to about the same height. The control gate and the select gate are separated by a relatively thin select gate dielectric. Silicides are formed on the surface of many electronic components to improve the electrical connection with a contact, but the surface of the electronic component expands and grows during the silicide formation. Silicides formed on the control gate and the select gate often grow to the point that they make an electrical connection over the top of the select gate dielectric, so the memory cell is shorted and does not function. Therefore, many memory cells are produced without surface silicides. The lack of a silicide on the surface of the select gate and the control gate increases electrical resistance at the contact, and thereby reduces the performance of the memory cell.

Accordingly, it is desirable to provide floating gate memory cells with silicides on the select gate and the control gate, and methods for manufacturing the same. In addition, it is desirable to provide floating gate memory cells with consistent floating barriers between the floating gate and the control gate, and methods of manufacturing the same. Furthermore, other desirable features and characteristics of the present embodiments will become apparent from the subsequent detailed description and the appended claims, taken in conjunction with the accompanying drawings and this background of the invention.

BRIEF SUMMARY

Integrated circuits and methods for manufacturing the same are provided. In an exemplary embodiment, a method for producing an integrated circuit includes removing a central plug from between a first memory cell and a second memory cell to define a center gap. Each of the first and second memory cells include a control gate with a control gate height, a cap overlying the control gate, a select gate adjacent to the control gate, and a select gate dielectric between the control gate and the select gate. The select gate is recessed to a select gate height while the cap overlies the control gate, where the select gate height is less than the control gate height. A memory spacer is formed adjacent to the control gate and overlying the select gate dielectric.

In another embodiment, a method is provided for manufacturing an integrated circuit. The method includes removing a central plug from between a first and second memory cell to define a center gap. Each of the first and second memory cells includes a control gate and a cap overlying the control gate. An organic barrier is formed within the center gap and overlying the first and second memory cells, and the organic barrier is recessed to expose the cap. The cap is removed while the organic barrier is within the gap.

An integrated circuit is provided in another embodiment. The integrated circuit includes a floating gate overlying a substrate, and a control gate overlying the floating gate. The control gate extends to a control gate height. A select gate is adjacent to the floating gate and the control gate, and the select gate extends to a select gate height less than the control gate height. A select gate silicide overlies the select gate, and a control gate silicide overlies the control gate. A select gate dielectric is positioned between the select gate and the control gate, and a memory spacer adjacent to the control gate overlies the select gate dielectric.

BRIEF DESCRIPTION OF THE DRAWINGS

The present embodiments will hereinafter be described in conjunction with the following drawing figures, wherein like numerals denote like elements, and wherein:

FIGS. 1-7 illustrate one embodiment of the integrated circuit and methods of manufacturing the same;

FIGS. 8 and 9 illustrate a second embodiment of the integrated circuit and methods of manufacturing the same; and FIGS. 10-19 illustrate a third embodiment of the integrated circuit and methods of manufacturing the same.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

In accordance with various embodiments herein, non-volatile memory cells are formed with a central plug between a first and second memory cell. Each memory cell has a stack with a floating gate underlying a floating barrier, a control gate overlying the floating barrier, and a cap overlying the control gate. A select gate is positioned adjacent to the stack such that the stack is between the central plug and the select gate. An organic barrier is formed overlying the memory cells, and the organic barrier is recessed to expose the cap while protecting lower components such as the floating barrier. The cap is removed to expose the top of the control gate, so a control gate silicide can be formed. In other steps, the select gate is recessed with the organic barrier while the control gate is protected, so a select gate height is less than a control gate height. A memory spacer is formed adjacent to the control gate such that the memory spacer increases the electrical isolation of the control gate and the select gate. The control gate and the select gate are separated by a select gate dielectric, but the memory spacer increases the separation such that the formation of a select gate silicide and a control gate silicide does not extend over the memory spacer to create an electrical short. The organic barrier is used to isolate selected components of the memory cells while other components are formed or modified, so the organic barrier increases manufacturing control. There are several embodiments of the process of manufacturing the integrated circuit, and different embodiments are described in greater detail below.

Figure 1:
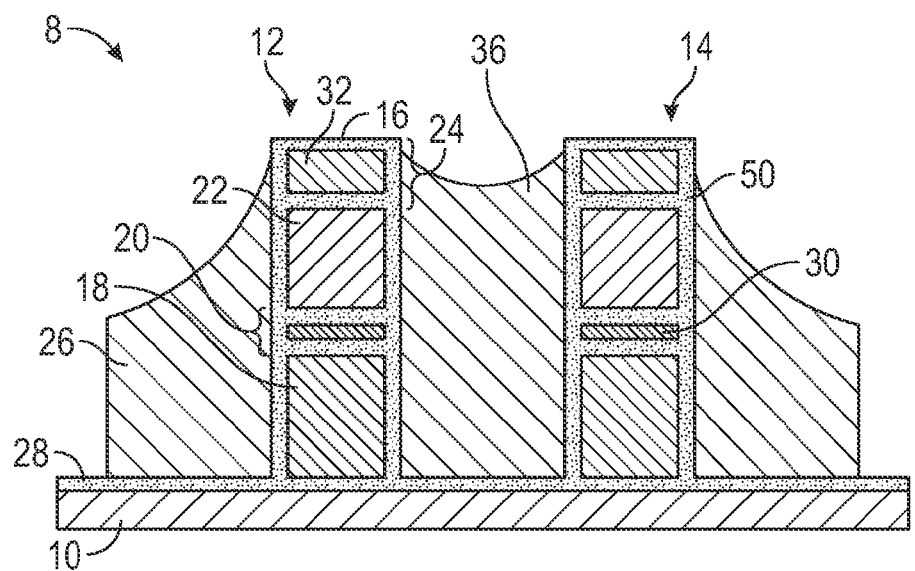
FIGS. 1-19 are cross-sectional views of an integrated circuit with a first memory cell and a second memory cell, and methods fabricating the same in accordance with exemplary embodiments. In particular.

Reference is made to an exemplary embodiment of an integrated circuit and a method for making an integrated circuit in FIG. 1. An integrated circuit 8 is provided with a first memory cell 12 and a second memory cell 14 formed overlying a substrate 10 using methods and techniques well known to those skilled in the art. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate 10 may be a bulk silicon wafer (as illustrated) or may be a thin layer of silicon on an insulating layer (commonly known as silicon-on-insulator or SOI) that, in turn, is supported by a carrier wafer.

The first memory cell 12 and the second memory cell 14 include a stack 16, where the stack 16 includes a floating gate 18 overlying the substrate 10, a floating barrier 20 overlying the floating gate 18, a control gate 22 overlying the floating barrier 20, and a cap 24 overlying the control gate 22. A select gate 26 is adjacent to the stack 16, and a base dielectric 28 encapsulates the stack 16 and is also positioned between the substrate 10 and each of the floating gate 18 and the select gate 26. In an exemplary embodiment, the floating gate 18, the control gate 22, and the select gate 26 are formed of polysilicon, such as about 90 mass percent or more polysilicon, but other materials are used in alternate embodiments. The base dielectric 28 and the floating barrier 20 are dielectric materials. In an exemplary embodiment, the base dielectric 28 is formed of silicon dioxide and the floating barrier 20 includes three layers, but other embodiments are also possible. For example, the floating barrier 20 may be an "ONO" layer, which is silicon dioxide over silicon nitride that is over silicon dioxide (sometimes referred to as Oxide-Nitride-Oxide). The ONO layer includes a floating dielectric nitride 30 between layers of silicon dioxide. The cap 24 may include a cap nitride layer 32 positioned with an encapsulating layer of silicon dioxide, where the cap nitride layer 32 is about 90 mass percent or more silicon nitride. The second memory cell 14 is a mirror image of the first memory cell 12, and a central plug 36 is positioned between the stack 16 of the first and second memory cells 12, 14. The central plug 36 is also formed of polysilicon in some embodiments, similar to the floating gates 18. The stack 16 is positioned between the central plug 36 and the select gate 26, so the select gate 26 is on the opposite side of the stack 16 from the central plug 36.

Figure 2:
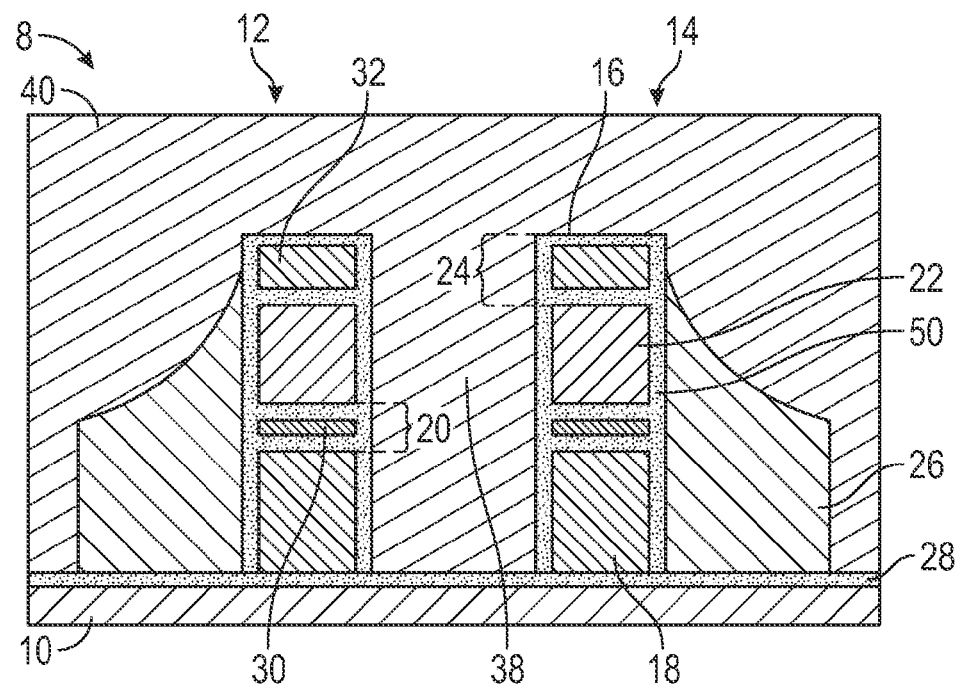

Referring to the exemplary embodiment of FIG. 2, the central plug 36 (from FIG. 1) is removed to define a center gap 38 between the first memory cell 12 and the second memory cell 14. The central plug 36 (from FIG. 1) is removed by masking the stacks 16 and select gates 26 of the first and second memory cells 12, 14, such as with photoresist, and etching the central plug 36 with an etchant selective to polysilicon, such as a hydrogen bromide plasma with about 3 mass percent oxygen. After formation of the center gap 38, the mask is removed and an organic barrier 40 is formed that fills the center gap 38 and overlies the first and second memory cells 12, 14 and other parts of the integrated circuit 8. The organic barrier 40 is an organic material that can be oxidized and removed from the integrated circuit 8 with an oxygen containing plasma, so the organic barrier 40 can usually be selectively removed without damage to non-organic portions of the integrated circuit 8. Examples of suitable organic materials include photoresist, polyimide polymers, poly(p-xylene) polymers, benzocyclobutanes, poly(arylene ethers), and organic xerogels, but many other organic materials can be used in other embodiments. In some embodiments, the organic barrier 40 is a dielectric material, but the organic barrier 40 may be electrically conductive in other embodiments. In many embodiments, the organic barrier 40 is spun onto the integrated circuit 8 as a liquid, and then cured to form a solid material. The organic barrier 40 is an organic material that can be oxidized and removed from the integrated circuit 8 with an oxygen containing plasma, so the organic barrier 40 can usually be selectively removed without damage to non-organic portions of the integrated circuit 8.

Figure 3:
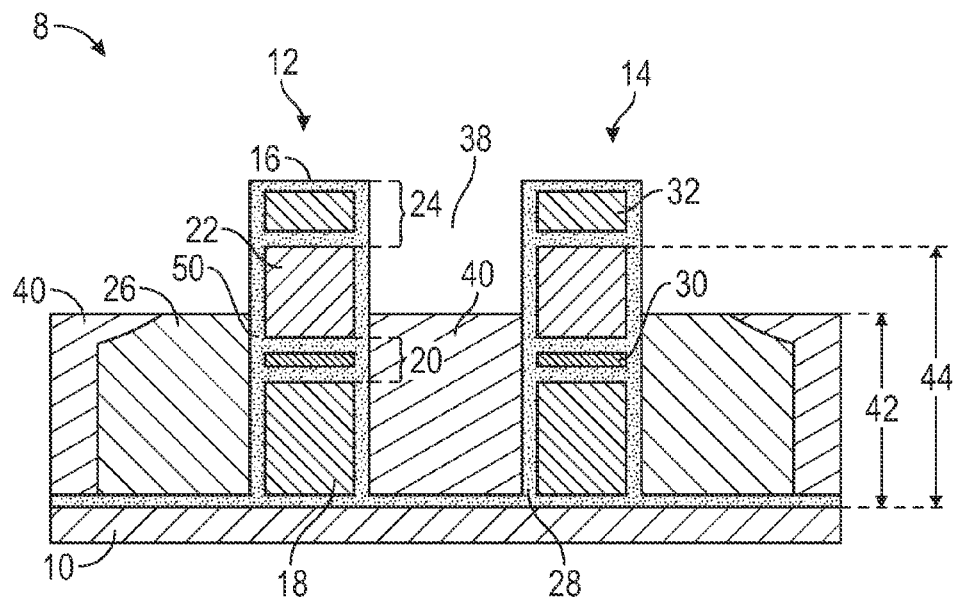

Reference is made to the exemplary embodiment in FIG. 3. The organic barrier 40 and the select gates 26 are recessed, where the select gates 26 are recessed to a select gate height indicated by the double headed arrow 42. The select gate height 42 is measured from a surface of the substrate 10 most proximate to the select gate 26 to a surface of the select gate 26 most remote from the substrate 10. The organic barrier 40 is recessed to a height that is higher than the floating barrier 20, so the floating barrier 20 remains protected by the organic barrier 40. The organic barrier 40 may be recessed to the select gate height 42 in some embodiments, but the organic barrier 40 is recessed to different heights in alternate embodiments. In an exemplary embodiment, the organic barrier 40 and the select gate 26 are recessed with an etchant selective to polysilicon and the material of the organic barrier 40. In one embodiment, the organic barrier 40 and the select gate 26 are simultaneously recessed, such as with a plasma including hydrogen bromide (to etch the polysilicon of the select gate 26) and oxygen (to etch the organic barrier 40). Chlorine may be added to the plasma to increase the etch rate of the polysilicon, and the etch rate for the material of the select gate 26 and the organic barrier 40 can be adjusted by manipulating the concentration of the various components in the plasma. In an alternate embodiment, the organic barrier 40 is etched in a first step, and the select gate 26 is etched in a second step. When separate etch steps are used, the vacuum used during the etch may or may not be broken when changing etchants in various embodiments.

Figure 4:
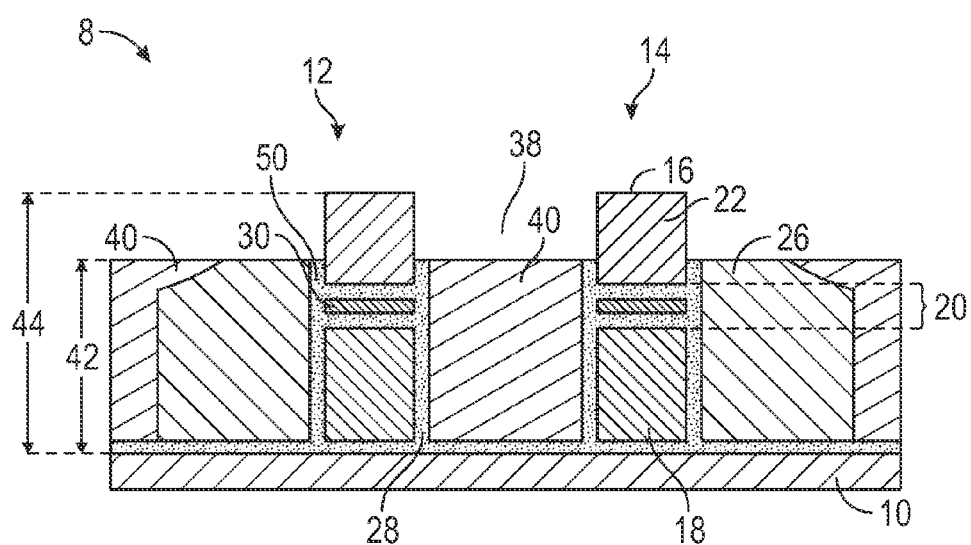

Referring to the exemplary embodiment in FIG. 4 with continuing reference to FIG. 3, the base dielectric 28 is removed from around the portions of the stack 16 that extend above the organic barrier 40 and the cap 24 is removed from over the control gate 22. The base dielectric 28 may be removed with a dilute hydrofluoric acid (DHF) wet etch, which exposes the cap nitride layer 32. The cap nitride layer 32 is then removed, such as with a hot phosphoric acid wet etch, and any remaining exposed base dielectric 28 can be removed with another DHF wet etch or may be thin enough to be removed with the hot phosphoric acid etch. The organic barrier 40 protects selected portions of the integrated circuit 8 during the etching steps, including the base dielectric 28 adjacent to the floating barrier 20. Therefore, the DHF wet etch does not attack base dielectric 28 adjacent to the floating barrier 20, and the hot phosphoric acid wet etch does not attack the floating dielectric nitride 30. As such, the floating barrier 20 remains essentially unchanged during the removal of the cap 24.

Figure 5:
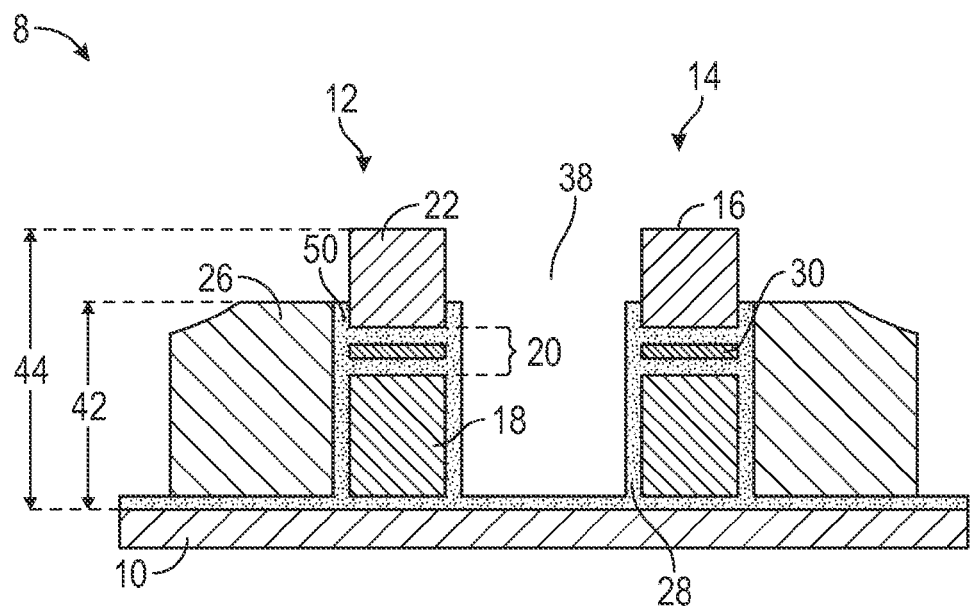

The organic barrier 40 is removed, such as with an oxygen containing plasma, as illustrated in an exemplary embodiment in FIG. 5. The control gate 22 extends to a control gate height 44 indicated by the double headed arrow 44, and the control gate height 44 is higher than the select gate height 42. The base dielectric 28 may be recessed in the center gap 38 in some embodiments (not illustrated), and the recess of the base dielectric 28 can be controlled such that some of the base dielectric 28 remains over the floating dielectric nitride 30. The base dielectric 28 is positioned between the floating barrier 20 and the center gap 38, so the floating barrier 20 is protected from etchants from within the center gap 38. Therefore, the remaining base dielectric 28 protects the floating dielectric nitride 30 such that it is not compromised.

Figure 6:
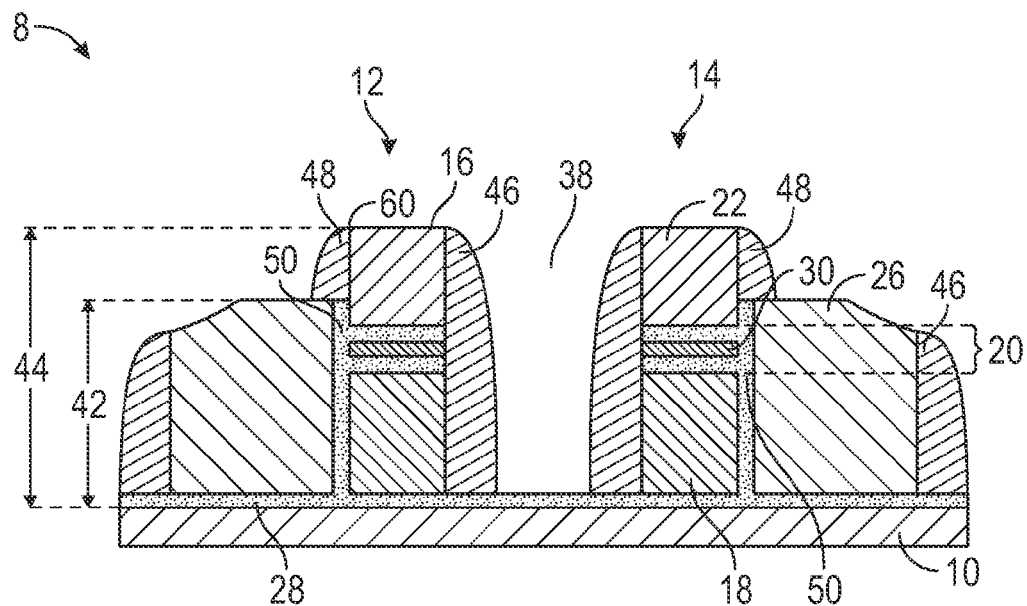

As illustrated in FIG. 6, spacers 46 are formed adjacent to the stack 16 and the select gate 26, and a memory spacer 48 is formed adjacent to the control gate 22 and overlying a select gate dielectric 50 positioned between the stack 16 and the select gate 26. The select gate dielectric 50 is formed with the base dielectric 28, and may be a part of the base dielectric 28. The base dielectric 28 between the center gap 38 and the stack 16 is a dielectric material, as is the spacer 46, so the base dielectric 28 between the center gap 38 and the stack 16 may be incorporated into the spacer 46 in some embodiments. The memory spacer 48 may overlie a portion of the select gate 26 in some embodiments, but the memory spacer 48 does not overlie the entire upper surface of the select gate 26. Spacers 46 are formed adjacent to vertical surfaces, so the difference in the select gate height 42 and the control gate height 44 provides a vertical surface for formation of the memory spacer 48. In addition, a sharp angle at an edge 60 of the vertical surfaces increases the formation of a spacer 46, and the edge 60 of the control gate 22 is sharp. The edge 60 is formed when the base dielectric 28 is removed, so the edge 60 is not dulled or rounded before formation of the memory spacer 48. In an exemplary embodiment, the spacers 46 (including the memory spacers 48) are formed with several layers (not illustrated). For example, the spacers 46 and memory spacers 48 are formed from a first layer of silicon dioxide (which may include part of the base dielectric 28 in some embodiments), a second layer of silicon nitride, a third layer of silicon dioxide, and a fourth layer of silicon nitride. The layers are individually deposited overlying the integrated circuit 8, such as by chemical vapor deposition, and then anisotropically etched to remove horizontal portions of the layers and leave material adjacent to vertical structures as a spacer. The process can be repeated for each layer of the spacer 46, or more than one layer may be deposited before an anisotropic etch. Various materials can be used for the spacers 46, but the material(s) of the spacer 46 and memory spacer 48 are dielectric materials. The memory spacer 48 is formed adjacent to the control gate 22, so the memory spacer 48 extends to about the control gate height 44. In an exemplary embodiment, the memory spacer 48 is about 0 to about 20 nanometers lower than the control gate 22.

Figure 7:
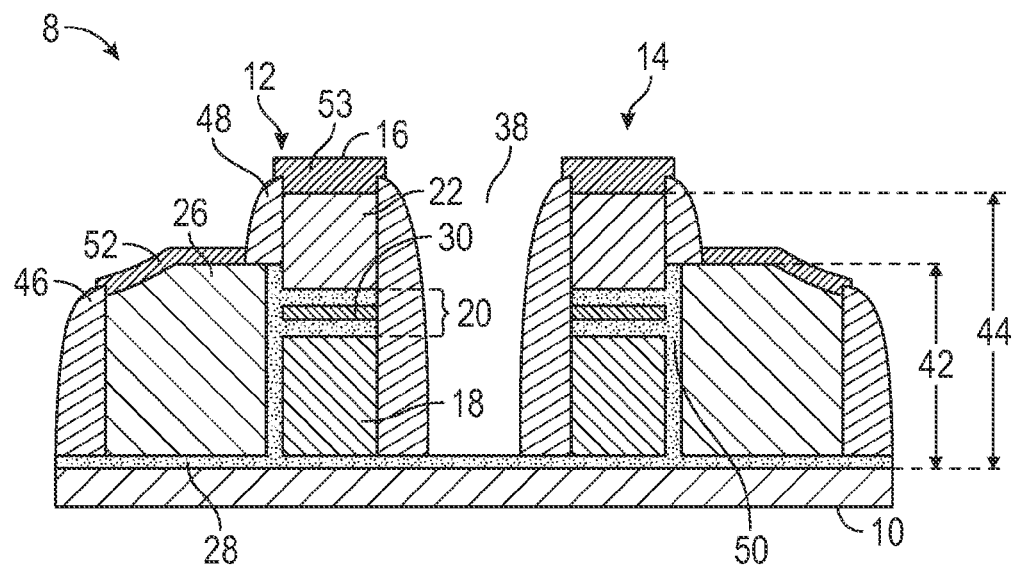

The uppermost surface of the select gate 26 and the control gate 22 are then silicided to form a select gate silicide 52 overlying the select gate 26 and a control gate silicide 53 overlying the control gate 22, as illustrated in FIG. 7. The select gate silicide 52 and the control gate silicide 53 provide a conductive surface for electrical connection with contacts or other materials. The memory spacer 48 is positioned between the select gate silicide 52 and the control gate silicide 53 such that the select gate silicide 52 and control gate silicide 53 are electrically isolated, and no electrical short is formed between them. The surface of the select gate 26 and the control gate 22 expand when silicided, but the memory spacer 48 provides a sufficient barrier to prevent the expanding surfaces from contacting each other. In an exemplary embodiment, a thin layer of metal is deposited on the exposed surfaces of the select gate 26 and the control gate 22, such as by sputtering or chemical vapor deposition, and the silicide is formed by a subsequent anneal. In one example, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch is then used to remove the metallic overburden, which does not react with materials other than the metal. For example, nickel can be selectively etched with a mixture of nitric acid, acetic acid, and sulfuric acid. The first and second memory cells 12, 14 are then incorporated into an integrated circuit 8 using methods and techniques well known to those skilled in the art.

Figure 8:
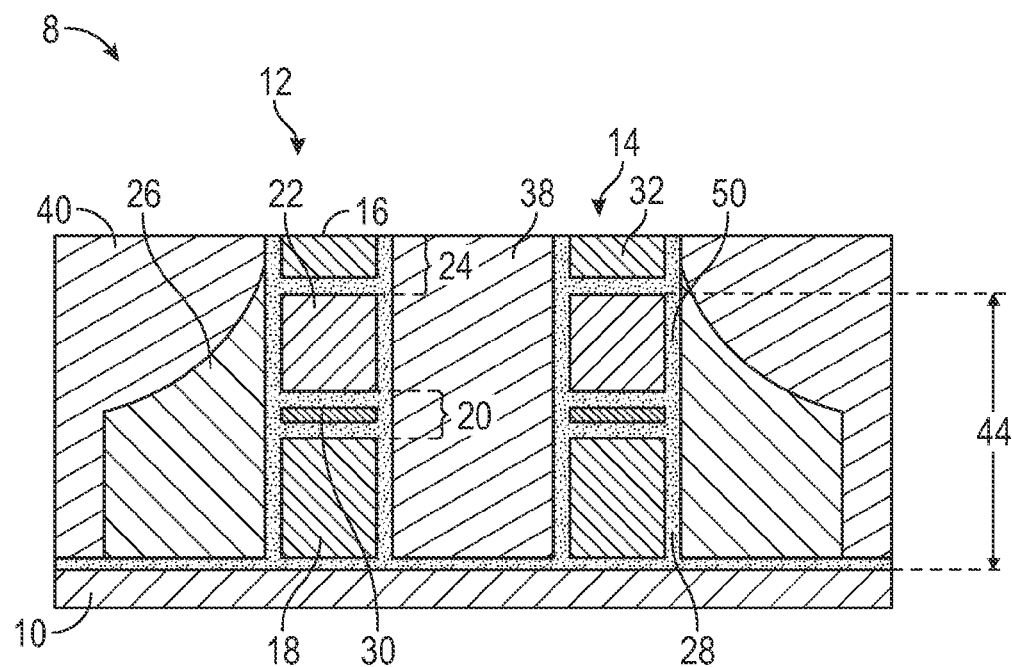
Figure 9:
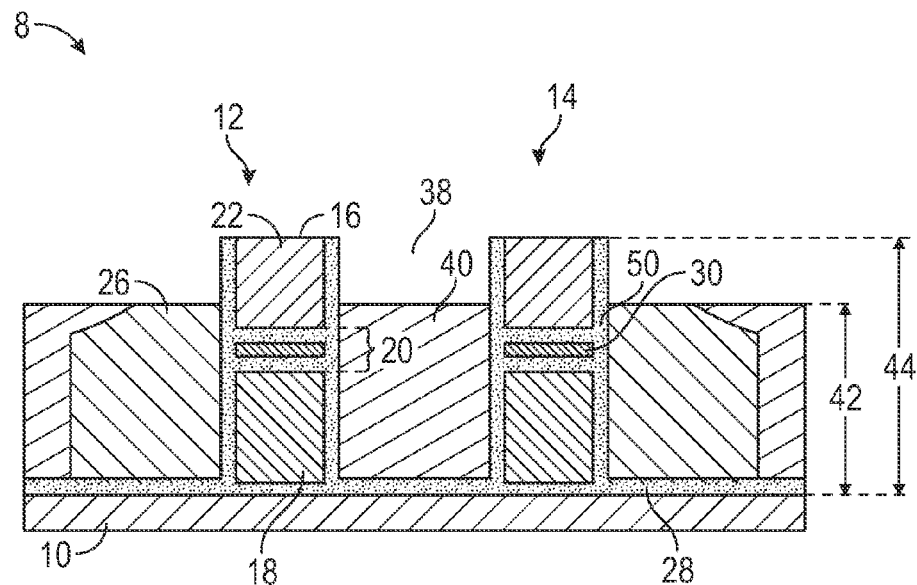

Another embodiment of the method of manufacturing the integrated circuit 8 is illustrated beginning with FIG. 8. FIG. 8 is comparable to FIG. 3, except the organic barrier 40 is recessed to a level that exposes the cap nitride layer 32 but does not significantly recess or expose the select gate 26. In an exemplary embodiment, the top silicon dioxide layer of the cap 24 and the cap nitride layer 32 are removed by an in-situ plasma etch in the same chamber as the organic barrier 40 recess etch, where an in-situ etch is an etch that changes chemistry without breaking vacuum. The chemistry change to remove the top silicon dioxide layer of the cap 24 and the cap nitride layer 32 may be the addition of a fluoride compound to the etch chemistry. After the cap nitride layer 32 is removed, the etch of the organic barrier 40 and the select gate 26 is resumed without the etchant chemistry that removes the silicon dioxide, as described above for FIG. 3. The silicon dioxide layer of the cap 24 that was underneath the cap nitride layer 32 remains as a mask to protect the control gate 22 during the etch. After the select gate 26 is recessed to the select gate height 42, the etch chemistry is changed again to remove the remaining silicon dioxide layer of the cap 24 that was under the cap nitride layer 32. This exposes the control gate 22, as described above and as illustrated in FIG. 9 with continuing reference to FIG. 8. The organic barrier 40 is then removed, such as with an oxygen containing plasma, and the process continues as described above beginning with FIG. 5. The embodiment of FIGS. 8 and 9 illustrates one possible way to alter the process steps in the manufacturing process, but other embodiments are also possible.

Figure 10:
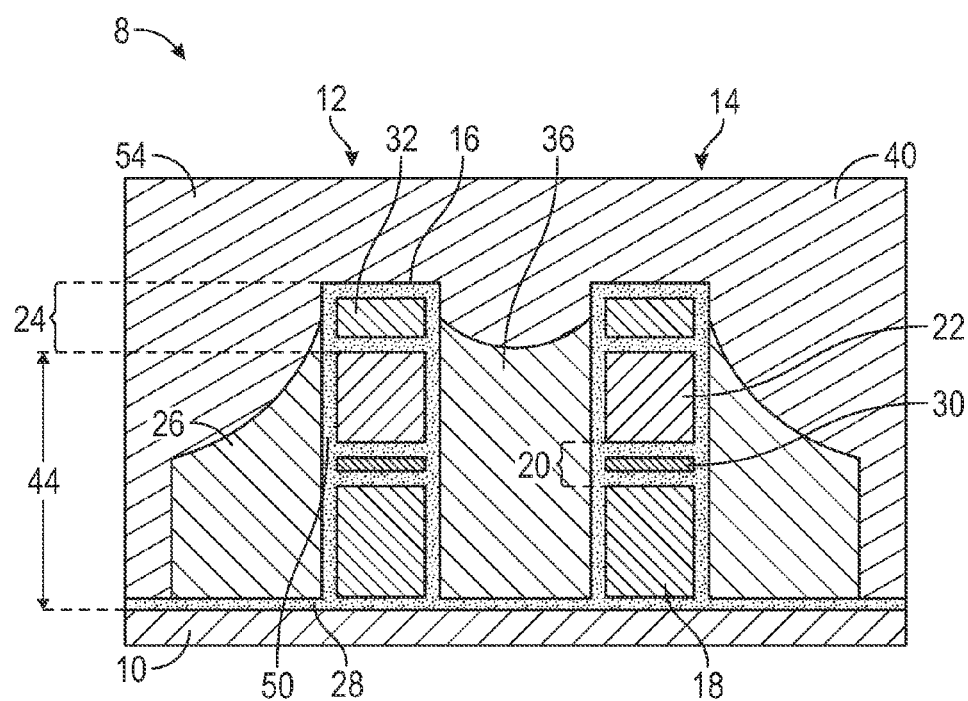
Figure 11:
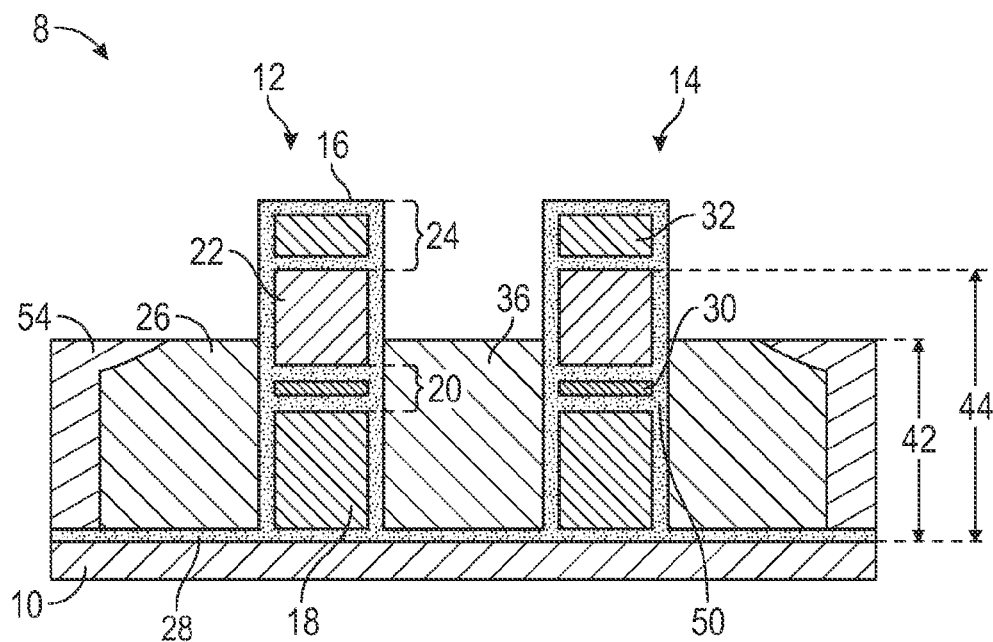
Figure 12:
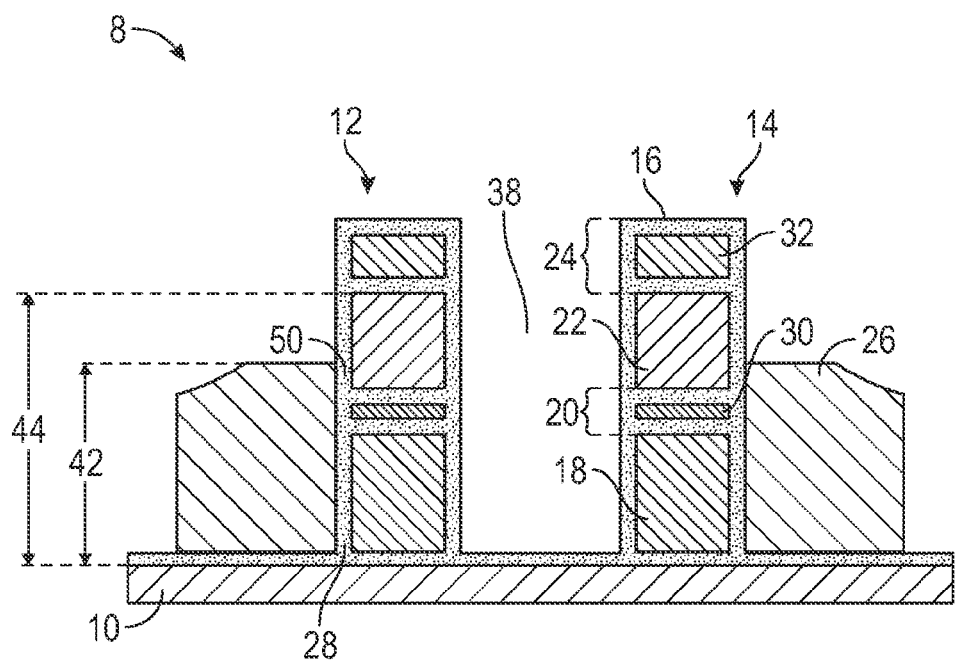

Yet another exemplary embodiment is illustrated beginning with FIG. 10. A first organic barrier 54 is formed overlying the first and second memory cells 12, 14 and the central plug 36. The first organic barrier 54 is formed of the same type of material described for the organic barrier above. Referring to FIG. 11, the organic barrier 40, the select gates 26, and the central plug 36 are recessed, where the select gates 26 and the central plug 36 are recessed to the select gate height 42. Similar processes to those described for FIG. 3 can be used to recess the organic barrier 40, select gates 26, and the central plug 36. The central plug 36 covers the floating barrier 20 during the recess step, so the floating barrier 20 is essentially unchanged when the recess step is completed. The central plug 36 is then removed to form the center gap 38, as illustrated in FIG. 12 with continuing reference to FIG. 11. A photoresist may be used to protect the first and second memory cells 12, 14 when removing the central plug 36, as described above for FIG. 2.

Figure 13:
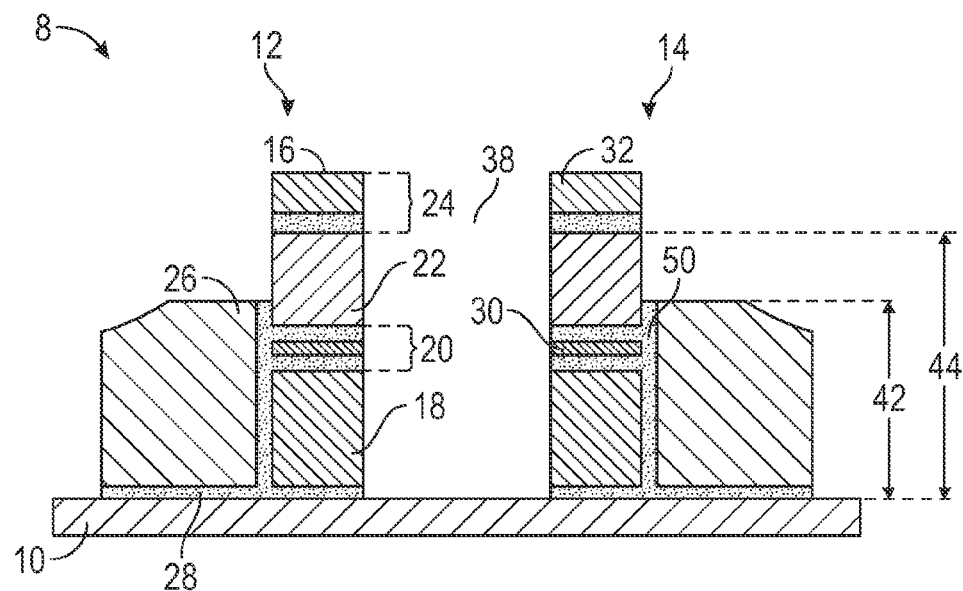

Referring the exemplary embodiment in FIG. 13, exposed portions of the base dielectric 28 are recessed or removed, such as with a DHF wet etch. There is little chance of the floating dielectric nitride 30 being etched when removing the base dielectric 28 because the floating dielectric nitride 30 is a different material than the base dielectric 28. Any silicon dioxide over and/or under the floating dielectric nitride 30 has little area that is exposed to the wet etch, so such silicon dioxide is not significantly etched. As such, the base dielectric 28 can be removed without damaging the floating barrier 20. In some embodiments (not illustrated), the base dielectric 28 is recessed but not removed, so some of the base dielectric 28 remains to protect the floating dielectric nitride 30. The cap nitride layer 32 remains in place on top of the control gate 22, because the cap nitride layer 32 is a different material than the base dielectric 28 and the etchant is selective to the material of the base dielectric 28.

Figure 14:
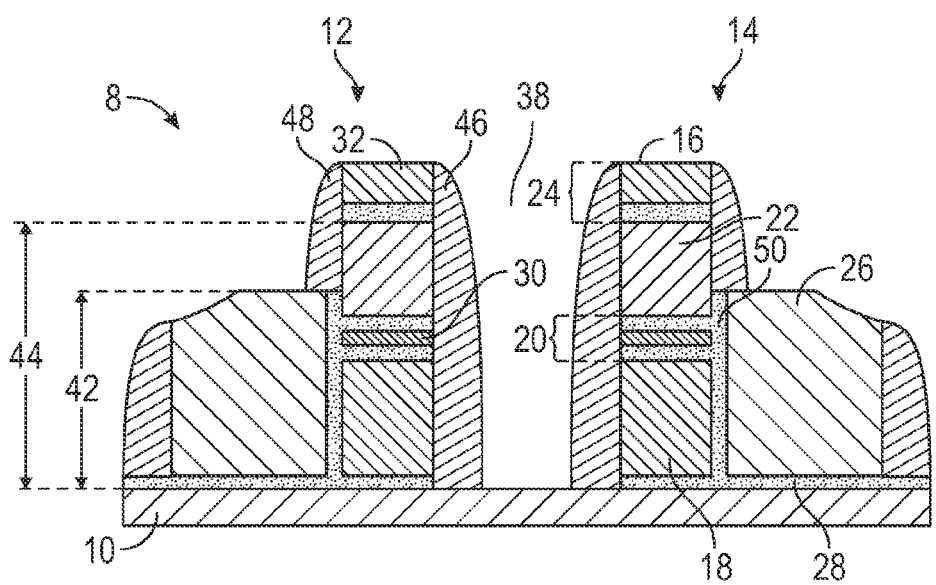

Spacers 46 and memory spacers 48 are formed adjacent to the vertical surfaces of the integrated circuit 8, as illustrated in FIG. 14 and as described above for FIG. 6. In this embodiment, the memory spacers 48 extend to near the upper surface of the cap nitride layer 32, because the cap nitride layer 32 remains on top of the control gate 22. Spacers 46 are positioned adjacent to the stack 16 within the center gap 38 and adjacent to the select gate 26 opposite the center gap 38. The top surface of the cap nitride layer 32 is higher than the control gate height 44, so the memory spacers 48 extend to a height that is higher than the control gate height 44, and higher than in the embodiments described above.

Figure 15:
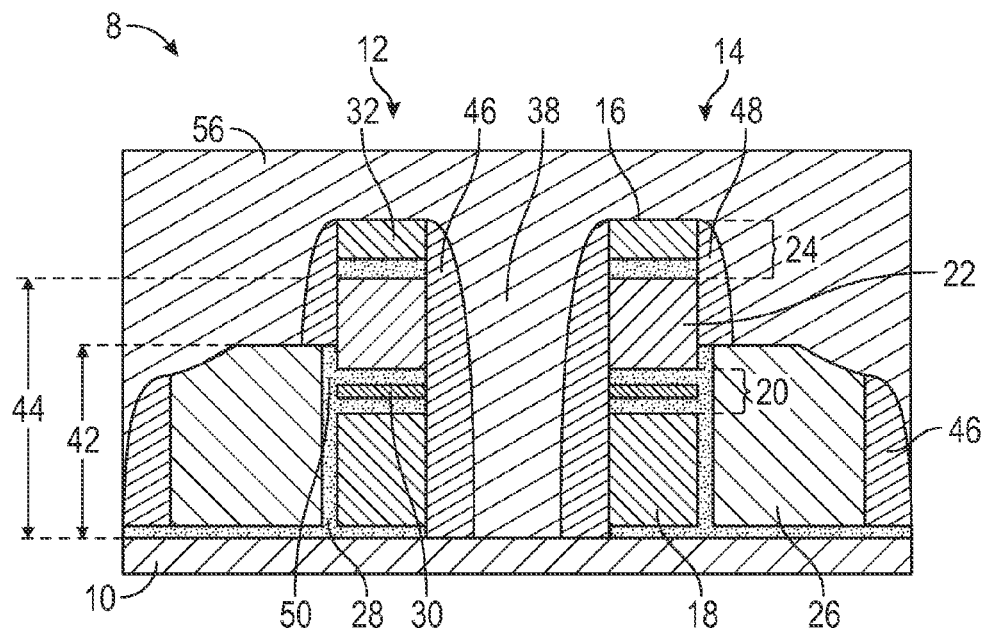
Figure 16:
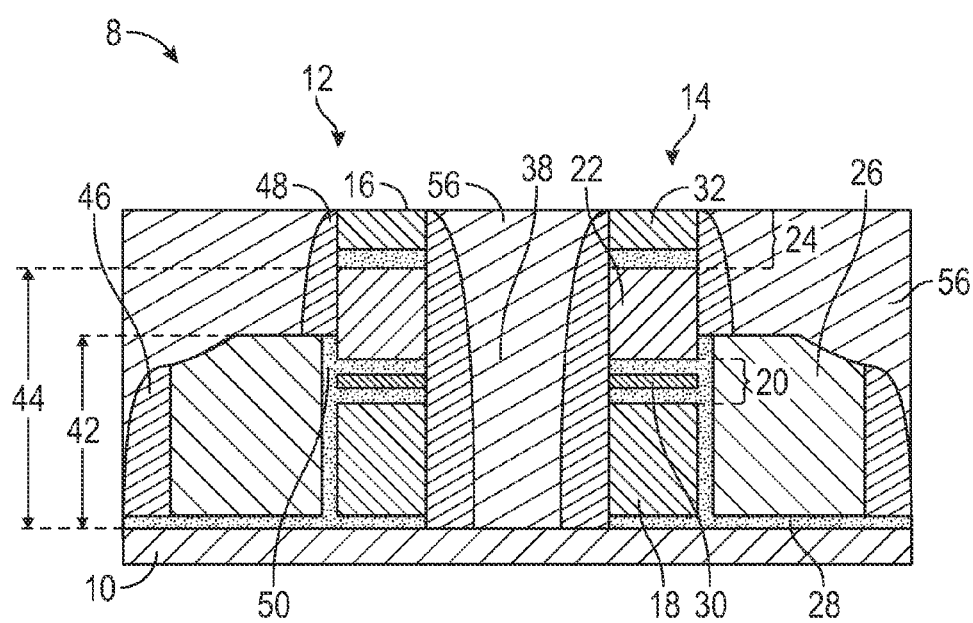
Figure 17:
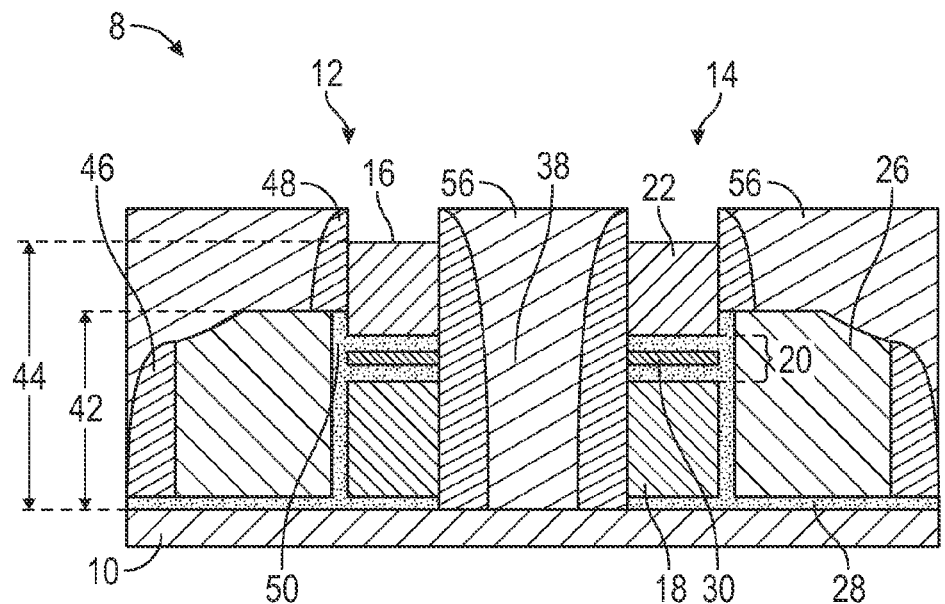
Figure 18:
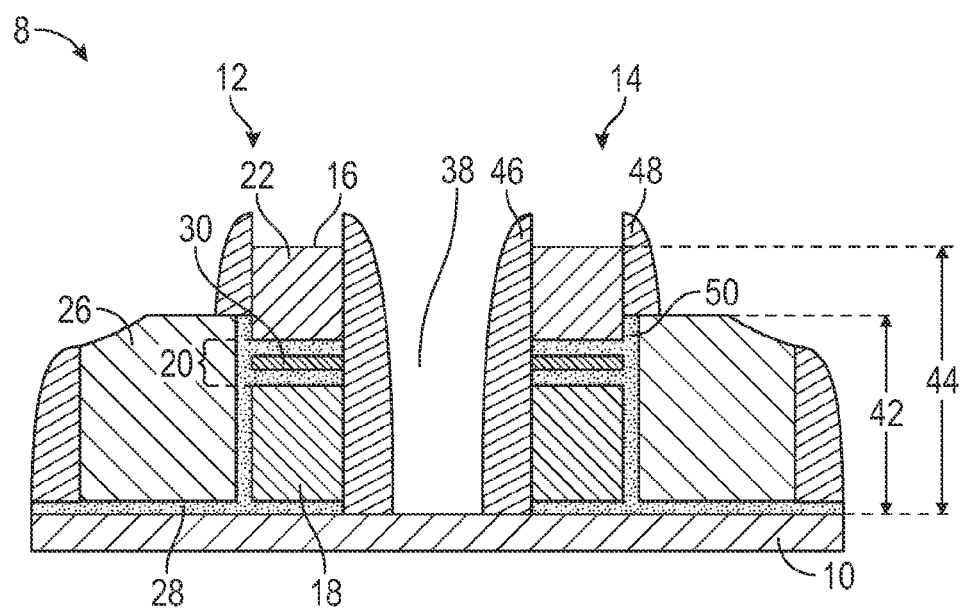

Referring to the exemplary embodiment illustrated in FIG. 15, a second organic barrier 56 is formed within the center gap 38 and overlying the first and second memory cells 12, 14 and other portions of the integrated circuit 8. The second organic barrier 56 is formed of the same type of material as described above for the organic barrier, and may be the same or different material as the first organic barrier described above. The second organic barrier 56 is then recessed to expose the cap nitride layer 32, as illustrated in an exemplary embodiment in FIG. 16. The recess of the second organic barrier 56 is controlled such that the second organic barrier 56 covers and protects much or all of the spacers 46, including the memory spacers 48. The cap nitride layer 32 is removed, such as with a wet etch using hot phosphoric acid, as illustrated in FIG. 17. The cap nitride layer 32 and any other parts of the cap 24 are removed while the second organic barrier 56 is within the center gap 38. The silicon dioxide underlying the cap nitride layer 32 is thin, so it may be removed with the hot phosphoric acid wet etch, or a separate DHF wet etch can be used to remove it. A small portion of the memory spacers 48 and the other spacers 46 may be exposed to the etchants used to remove the cap 24, but the second organic barrier 56 covers most of the spacers 46 and memory spacers 48 so little material is removed from the spacers 46. The second organic barrier 56 is then removed, as illustrated in FIG. 18. The memory spacer 48 extends above the top surface of the control gate 22, so the memory spacer 48 has a "horn" extending above the control gate height 44.

Figure 19:
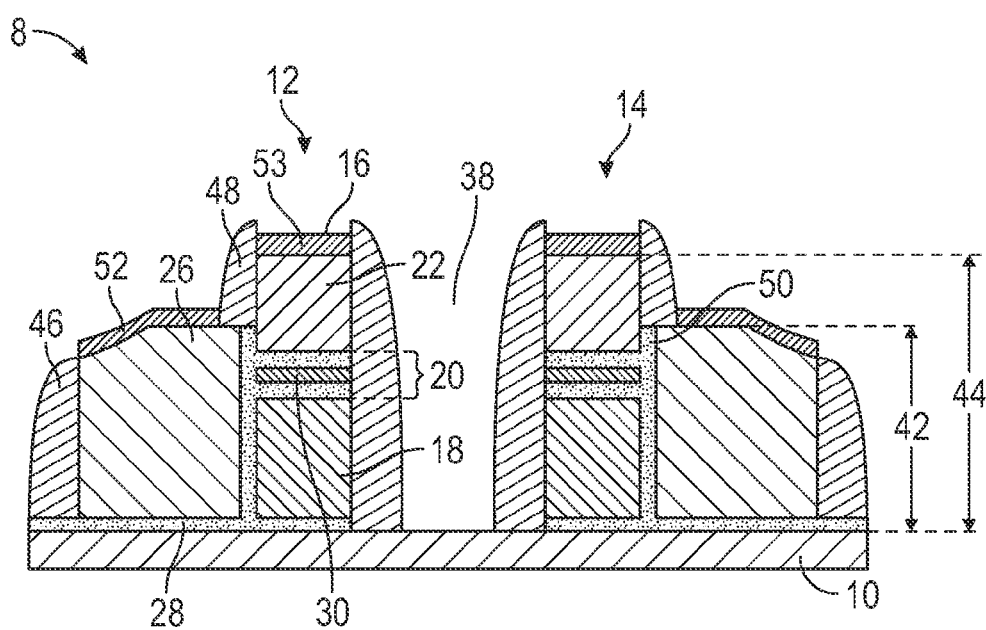

The top surface of the control gate 22 and the select gate 26 are silicided to form the surface silicide, as illustrated in an exemplary embodiment in FIG. 19 and as described above for FIG. 7. The "horn" provides a significant barrier between the top surface of control gate 22 and the top surface of the select gate 26, so there is essentially no chance for the surface silicide to make an electrical connection between the control gate 22 and the select gate 26. The "horn" provides more significant electrical separation of the control gate 22 and the select gate 26. The "horn" also limits the control gate silicide 53 to vertical expansion without any appreciable horizontal expansion, and limits the select gate silicide 52 to vertical expansion on the side closest to the control gate 22. Limiting or preventing horizontal expansion of the select gate silicide 52 and the control gate silicide 53 is very effective in preventing contact or a short between the select gate 26 and the control gate 22.

While various exemplary embodiments have been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of manufacturing an integrated circuit comprising:
   removing a central plug from between a first memory cell and a second memory cell to define a center gap between the first memory cell and the second memory cell, wherein each of the first memory cell and the second memory cell comprises a control gate having a control gate height, a cap overlying the control gate, a select gate adjacent to the control gate, and a select gate dielectric between the control gate and the select gate;
   recessing the select gate to a select gate height while the cap overlies the control gate, wherein the select gate height is less than the control gate height; and
   forming a memory spacer overlying the select gate dielectric and adjacent to the control gate.

2. The method of claim 1 wherein forming the memory spacer comprises forming the memory spacer such that the memory spacer extends to a height higher than the select gate height.

3. The method of claim 1 wherein forming the memory spacer comprises forming the memory spacer to about the control gate height.

4. The method of claim 1 further comprising:
forming an organic barrier within the center gap and overlying the cap;
recessing the organic barrier to expose the cap; and
removing the cap while the organic barrier is within the center gap.

5. The method of claim 4 further comprising:
removing the organic barrier; and
wherein forming the memory spacer comprises forming the memory spacer after removing the organic barrier.

6. The method of claim 4 wherein:
forming the organic barrier comprises forming a second organic barrier after forming the memory spacer; and
recessing the select gate to the select gate height further comprises:
forming a first organic barrier overlying the select gate; and
recessing the select gate before forming the second organic barrier.

7. The method of claim 1 wherein forming the memory spacer comprising forming the memory spacer overlying a portion of the select gate.

8. The method of claim 1 further comprising:
forming a select gate silicide overlying the select gate and forming a control gate silicide overlying the control gate.

9. The method of claim 8 wherein forming the select gate silicide and the control gate silicide comprises forming the select gate silicide and the control gate silicide with the memory spacer positioned between the select gate silicide and the control gate silicide.

10. The method of claim 1 further comprising:
forming an organic barrier overlying the select gate; and
wherein recessing the select gate further comprises recessing the organic barrier.

11. A method of manufacturing an integrated circuit comprising:
removing a central plug from between a first memory cell and a second memory cell to define a center gap, wherein each of the first memory cell and the second memory cell comprise a control gate and a cap overlying the control gate;
forming an organic barrier within the center gap and overlying the first memory cell and the second memory cell;
recessing the organic barrier to expose the cap; and
removing the cap while the organic barrier is within the center gap.

12. The method of claim 11 wherein removing the cap further comprises:
removing a cap nitride layer of the cap, wherein the cap nitride layer comprises silicon nitride.

13. The method of claim 11 further comprising:
recessing a select gate to a select gate height lower than a control gate height, wherein the select gate is adjacent to the control gate.

14. The method of claim 13 wherein recessing the select gate comprises recessing the select gate while recessing the organic barrier.

15. The method of claim 13 wherein recessing the select gate comprises recessing the select gate while recessing a first organic barrier; and
wherein recessing the organic barrier to expose the cap comprises recessing a second organic barrier to expose the cap after recessing the select gate.

16. The method of claim 13 further comprising:
forming a memory spacer overlying a select gate dielectric, wherein the select gate dielectric is positioned between the select gate and the control gate.

17. The method of claim 16 further comprising:
forming a select gate silicide overlying the select gate; and
forming a control gate silicide overlying the control gate, wherein the select gate silicide is electrically isolated from the control gate silicide.

18. The method of claim 16 wherein forming the memory spacer comprises forming the memory spacer to a height higher than the control gate height.

19. The method of claim 16 wherein forming the memory spacer comprises forming the memory spacer to about the control gate height.

20. An integrated circuit comprising:
a floating gate overlying a substrate;
a control gate overlying the floating gate, wherein the control gate extends to a control gate height;
a control gate silicide overlying the control gate;
a select gate adjacent to the floating gate and the control gate, wherein the select gate extends to a select gate height less than the control gate height;
a select gate silicide overlying the select gate;
a select gate dielectric positioned between the select gate and the control gate; and
a memory spacer adjacent to the control gate and overlying the select gate dielectric.

\* \* \* \* \*